United States Patent [19]

Yano et al.

[11] Patent Number: 5,483,568
[45] Date of Patent: Jan. 9, 1996

[54] PAD CONDITION AND POLISHING RATE MONITOR USING FLUORESCENCE

[75] Inventors: Hiroyuki Yano, Wappingers Falls; Katsuya Okumura, Poughkeepsie, both of N.Y.

[73] Assignee: Kabushiki Kaisha Toshiba, Japan

[21] Appl. No.: 335,384

[22] Filed: Nov. 3, 1994

[51] Int. Cl.⁶ .................................................. H01L 21/306
[52] U.S. Cl. ................... 378/44; 378/50; 451/6; 451/8; 156/626.1; 156/627.1
[58] Field of Search ................... 216/85, 86; 156/626.1, 156/627.1; 451/6, 8; 378/44, 50, 47, 54, 53, 58, 83, 88, 89

[56] References Cited

U.S. PATENT DOCUMENTS

| | | | |
|---|---|---|---|
| 4,417,355 | 11/1983 | Anisovich et al. | 378/49 |
| 5,069,002 | 12/1991 | Sandhu et al. | 156/626.1 |
| 5,081,796 | 1/1992 | Schultz | 364/474.06 |
| 5,113,421 | 5/1992 | Gignoux et al. | 378/50 |
| 5,196,353 | 3/1993 | Sandhu et al. | 437/8 |
| 5,222,329 | 6/1993 | Yu | |
| 5,240,552 | 8/1993 | Yu et al. | 156/626.1 |
| 5,245,794 | 9/1993 | Salugsugan | |
| 5,265,378 | 11/1993 | Rostoker | |
| 5,280,176 | 1/1994 | Jach et al. | 250/305 |
| 5,308,438 | 5/1994 | Cote et al. | 156/627.1 |
| 5,362,969 | 11/1994 | Glenn | 156/626.1 |
| 5,399,229 | 3/1995 | Stefani et al. | 156/626.1 |

*Primary Examiner*—David P. Porta
*Assistant Examiner*—Don Wong
*Attorney, Agent, or Firm*—Banner & Allegretti, Ltd.

[57] ABSTRACT

The invention is directed to a method for detecting the chemical mechanical polishing rate of a surface of a semiconductor wafer. In chemical mechanical polishing, a slurry made of abrasive particles suspended in a chemically abrasive liquid is dispensed on the surface of a rotating polishing pad. The wafer to be polished is rotated and lowered into contact with the rotating polishing pad. The method includes directing an X-ray beam at an exposed surface area of the polishing pad, and detecting the intensity of the X-ray fluorescence which results from the beam illuminating the pad. Since both the CMP rate of removal of a wafer surface and the intensity of the X-ray fluorescence are functions of the density of the abrasive particles in the slurry, the CMP rate of removal can be expressed as a function of the density. Accordingly, the detected intensity of the X-ray fluorescence can be converted directly into the CMP rate, without interfering with the CMP process.

23 Claims, 5 Drawing Sheets

5,483,568

PAD CONDITION AND POLISHING RATE MONITOR USING FLUORESCENCE

BACKGROUND OF THE INVENTION

1. Field of Invention

This invention is directed to a machine for polishing semi-conductor wafers, and more particularly, to a machine in which the polishing rate of the wafer surface and the condition of the polishing pad may be continually monitored.

2. Description of the Prior Art

Machines for preparing and fabricating semi-conductor wafers are known in the art. Wafer preparation includes slicing semi-conductor crystals into thin sheets, and polishing the sliced wafers to free them of surface irregularities, that is, to achieve a planar surface. In wafer fabrication, devices such as integrated circuits or chips are imprinted on the prepared wafer. Each chip carries multiple thin layers of conducting metals, semiconductors and insulating materials such as oxides, each of which may require polishing during fabrication. The polishing process may be accomplished by an abrasive slurry lapping process in which a wafer mounted on a rotating carrier is brought into contact with a rotating polishing pad upon which is sprayed a slurry of insoluble abrasive particles suspended in a liquid. Material is removed from the wafer by the mechanical buffing action of the slurry. The polishing step often includes a chemical mechanical polishing ("CMP") process. CMP is the combination of mechanical and chemical abrasion, and may be performed with an acidic or basic slurry. Material is removed from the wafer due to both the mechanical buffing and the action of the acid or base.

Devices for performing chemical mechanical polishing are known in the art, for example, U.S. Pat. No. 5,308,438 to Cote et al, incorporated by reference. The device of Cote includes a rotatable circular polishing platen having a circular polishing pad mounted thereon. A rotatable polishing head or carrier adapted for holding and rotating a workpiece such as a semi-conductor wafer is suspended over the platen. The carrier and platens are rotated by separate motors. A slurry dispensing tube is disposed over the polishing pad. In operation, a slurry, for example, an oxidizing agent such as iron nitrate dispersed in water with aluminum oxide particles suspended therein, is dispensed on the upper surface of the rotating polishing pad. The rotating wafer is brought into contact with the pad and is polished due to the mechanically abrasive action of the aluminum oxide particles and the chemically abrasive action of the oxidizing agent.

Chip fabrication requires the formation of layers of material having relatively small thicknesses. For example, a typical metal conducting layer will have a thickness on the order of 2,000–6,000 Å, and a typical insulating oxide layer may have a thickness on the order of 4,000 Å. The thicknesses will depend upon the function of the layer. A gate oxide layer may have a thickness of less than a hundred Å and a field oxide layer may have a thickness of several thousand Å. Nonetheless, the thickness of the layers must be formed within very strict tolerances, for example, 500 Å, in order to ensure that the desired operating parameters of the chip are achieved. Further, if the tolerances are not met, short circuits, or other defects which result in inoperative chips may result.

During chip fabrication, the layers are formed and then selected amounts of material must be removed without removing excess amounts of the underlying material in order to provide layers having thicknesses within the desired tolerances. One way to ensure that the selected amounts of material are removed in order to form layers having the desired thickness is by monitoring of the thickness of the layers during CMP. For example, the surface of the wafer may be physically examined by techniques which directly ascertain the dimensional and planar characteristics of the wafer, utilizing tools such as surface profilometers, ellipsometers or quartz crystal oscillators. However, use of these devices requires that the wafer be removed from the CMP apparatus. If the wafer does not meet specifications, it must be reloaded onto the apparatus and polished again. This process is time consuming and labor intensive, and decreases production efficiency. Further, if it is determined that too much material has been removed, the chip may have to be returned to the location at which the layers of material are applied, or may even be unusable.

A second way to ensure that desired amounts of material have been removed is by real time monitoring of the layer thickness as the wafer is being polished. Such a device is shown in U.S. Pat No. 5,240,552 to Yu et al, incorporated by reference, which makes use of acoustic waves which are directed at and reflected from the wafer during CMP. The reflected waves are detected and a determination is made of the total time the wave has travelled in the wafer. If the velocity of the waves through the water is known, the total thickness of the wafer and thus of a film layer thereon can be determined. However, the device of Yu et al requires complex circuitry for generating and detecting the acoustic wave. In particular, Yu makes use of a first piezoelectric transducer which is disposed between the wafer carrier and carrier pad in order to generate, in response to a voltage, an acoustic wave which will travel into and be reflected from a wafer, and a second similarly disposed piezoelectric transducer which converts the reflected acoustic wave back into a voltage. The transducers must be connected by conducting wires to an analyzing circuit, with the wires disposed in holes formed through the carrier. The fact that the Yu device includes components which are placed in physical contact with the moving parts of the CMP apparatus complicates the apparatus. Further, over time the effectiveness of the circuit may be deteriorated by the motion ;associated with polishing.

In principle, CMP also can be monitored by knowing with great certainty the CMP rate, that is, the rate at which material is being removed from the layer being polished. However, several factors affect the polishing rate. For example, during polishing the abrasive material of the slurry becomes embedded in the material of the polishing pad, reducing the density of material in the slurry. Further, the material being removed from the layer being polished becomes embedded in the pads, and the pads tend to become degraded over time during the polishing procedure. All of these factors affect the CMP rate and as a result, the rate is not constant throughout the usable life of a pad. In fact, the CMP rate is erratic even during CMP of one production lot of wafers and in some cases, CMP of a single wafer.

With reference to FIG. 1, a graph of the CMP rate versus total pad use time is shown for a single polishing pad. The graph of FIG. 1 is for oxide polishing with a slurry of Ceria ($CeO_2$). The CMP rate of a layer of a CVD (chemical vapor deposition) oxide as expressed in the reduction of thickness of the layer per minute, is not stable, especially in the earlier stages of the usable life of a pad under approximately 600 minutes when the polishing rate increases greatly with continued use. Though the polishing rate is less erratic thereafter, it still varies above and below the rate of 7000 Å per minute. Furthermore, it is not possible to tell when the pad has worn out, which would cause the polishing rate to be reduced.

Accordingly, due to the non-stable CMP rate, in order to ensure that selected amounts of material are removed within acceptable tolerances using knowledge of CMP rate, it is necessary to measure the polishing rate before each production lot of wafers, and in some cases, where the tolerances are small, before CMP of each wafer. Such measuring requires that at least one otherwise usable production wafer be monitored during a test polishing procedure to make an accurate determination of the polishing rate. Thus, both time and a usable wafer must be wasted. As a result, the overall efficiency of production during use of CMP is compromised. Further, even with these procedures, it is not possible to determine the instantaneous CMP rate.

SUMMARY OF THE INVENTION

The present invention is directed to a method for detecting the polishing rate during abrasive polishing of the surface of a semi-conductor wafer in which a slurry including a liquid having a suspension of abrasive particles is sprayed upon a rotating polishing pad, and the rotating semi-conductor wafer is brought into contact with the polishing pad. A surface of the pad is exposed during contact. The method includes: directing electromagnetic radiation onto the exposed surface area of the pad; detecting the intensity of the electromagnetic radiation produced due to the electromagnetic radiation being directed upon the pad; and converting the detected intensity into a polishing rate of removal of the surface of the wafer by utilizing a predetermined known relationship between the intensity and the polishing rate.

In a further embodiment the electromagnetic radiation is a beam which stimulates fluorescence in the slurry and the intensity of the fluorescence is detected.

In a further embodiment the beam is an X-ray beam and the fluorescence is X-ray fluorescence.

In a further embodiment, the abrasive polishing is chemical mechanical polishing.

In a further embodiment, the invention is directed to an apparatus for detecting the polishing rate during abrasive polishing of the surface of a sem-iconductor wafer. The apparatus includes an X-ray tube for emitting X-rays towards the surface of a polishing pad, and an X-ray spectrometer for detecting the X-ray fluorescence from the surface of the pad.

The foregoing and other features, aspects and advantages of the present invention will become apparent from the following detailed description when read in conjunction with the accompanying drawings.

DETAILED DESCRIPTION OF THE PREFERRED EMBODIMENTS

Figure 2:
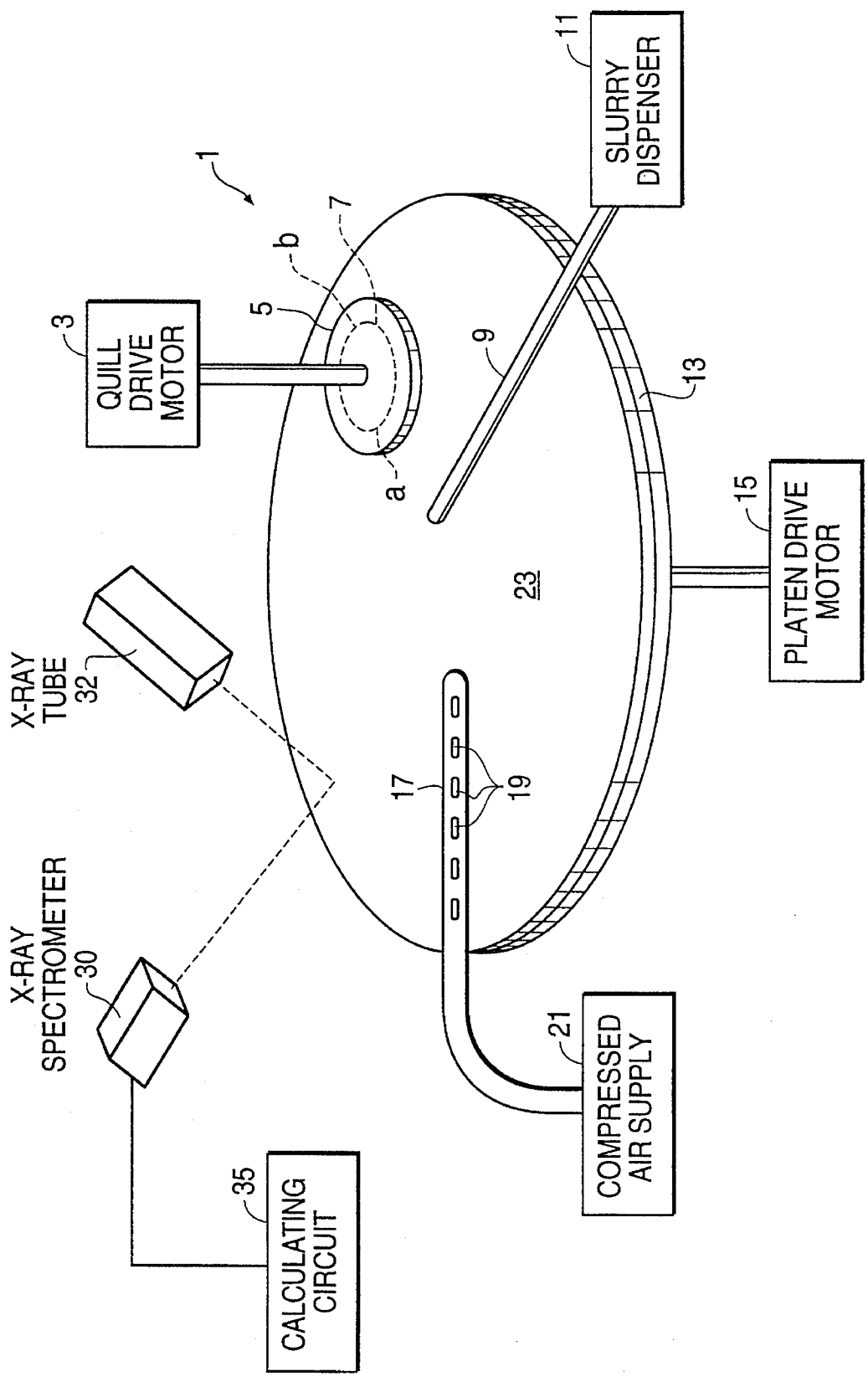
FIG. 2 is a perspective view of a CMP polishing apparatus including a polishing rate monitor according to the present invention.
Figure 3:
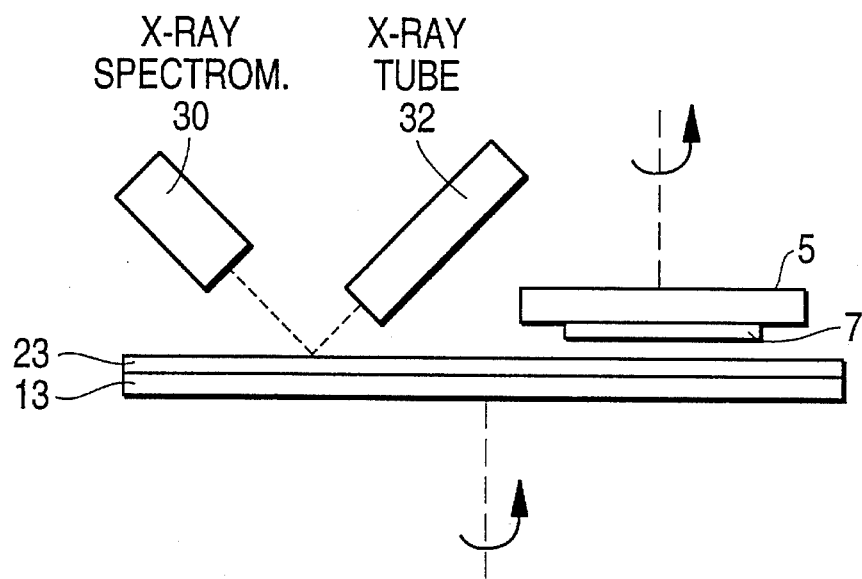
FIG. 3 is a simplified side view of the apparatus shown in FIG. 2.
Figure 4:
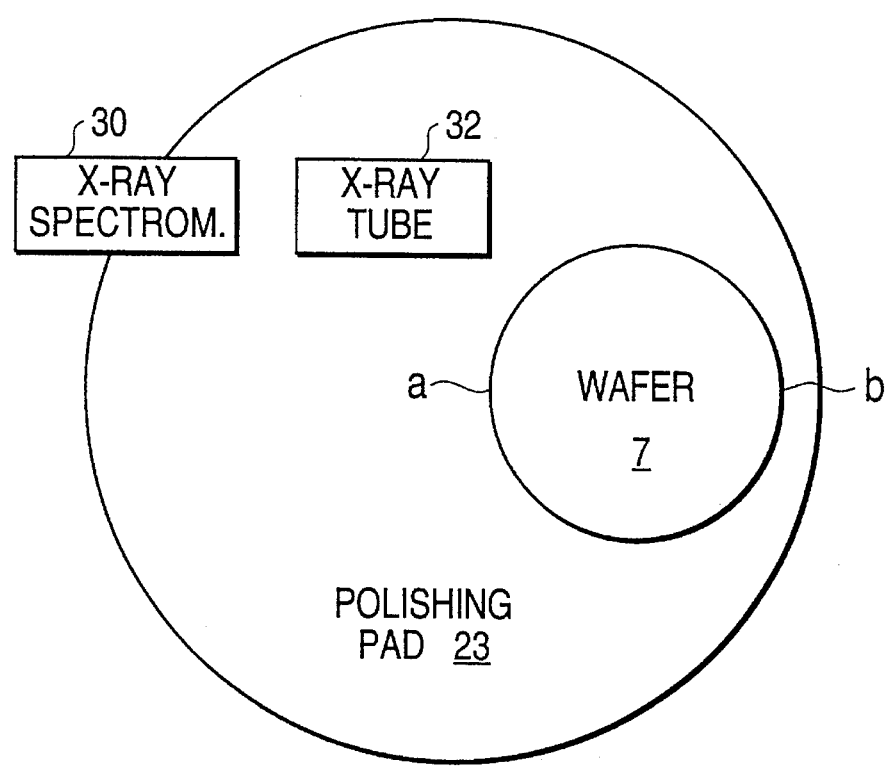
FIG. 4 is a simplified top view of the apparatus shown in FIG. 2.

With reference to FIGS. 2–4, apparatus 1 including a CMP table and a CMP rate monitor according to the invention is shown. The inventive apparatus includes polishing platen 13 which is rotatable by platen drive motor 15 and having a conventional semi-conductor wafer polishing pad 23 disposed thereon. Workpiece, for example, semi-conductor wafer 7 is suspended over pad 23 from carrier 5, which is rotated by quill drive motor 3. Slurry dispenser 11 dispenses slurry upon the surface of polishing pad 23 through elongated tube 9. Rotating wafer 7 is lowered into contact with rotating pad 23 to perform CMP in a conventional manner.

Apparatus 1 further includes elongated pipe 17 having holes 19 formed therethrough and linked via a flexible tube to compressed air supply 21. Air from supply 21 is directed to the surface of pad 23 through holes 19, and serves to blow away the polishing products which may be trapped by the pad fibers, and to reduce the matting of the pad. Air supply 21 preferably is used for CMP of a metal layer. All of the above-described structure is conventional and is shown, for example, in the above-discussed patent to Cote et at. Alternatively, for CMP of an oxide layer with a slurry including cerium, it is preferred to replace air supply 21 with a nylon brush. Other suitable conventional mechanisms for performing CMP on wafers are shown in U.S. Pat. No. 5,069,002 to Sandhu et at, and U.S. Pat. No. 4,481,741 to Bouladon et al, both of which are incorporated by reference. The choice of slurry and polishing pad will depend upon the type of polishing which is being performed.

Apparatus 1 further includes conventional X-ray emitting tube 32 and conventional X-ray spectrometer 30. For example, suitable tubes 32 and spectrometers 30 are sold by Rigaku. Tube 32 and spectrometer 30 are mounted above pad 23. Though not shown, the manner in which tube 32 and spectrometer 30 would be mounted would be conventional, for example, by brackets. X-ray tube 32 is angled so as to emit an X-ray beam upon a surface of pad 23 which is not covered by wafer holder 5 during CMP. X-ray spectrometer 30 is mounted at a corresponding angle so as to receive the X-ray fluorescence from pad 23 which results from the beam emitted by tube 32 illuminating pad 23. Spectrometer 30 measures the intensity in counts per second at the given frequency of fluorescence. The intensity is dependent upon the slurry which is disposed upon pad 23, and in particular, the density of the suspended particles in the liquid. The frequency at which X-ray fluorescence occurs for a given slurry would be known to the skilled artisan. Accordingly, spectrometer 30 would be tuned to allow for detection of fluorescence having the expected frequency.

Calculating circuit 35 such as a microprocessor is coupled to X-ray spectrometer 30. Calculating circuit 35 is programmed to use a functional relationship between X-ray intensity and CMP rate to be described below to calculate CMP rate. Calculating circuit 35 is preferably coupled to an output device such as a visual display or a printer for the purpose of outputting the calculated CMP rate to an operator.

Calculating circuit 35 may be, if desired, part of a control circuit for controlling the ON/OFF switching of X-ray emitter tube 32 and may be separate from or incorporated with control circuitry for controlling motors 3 and 15, dispenser 11 and air supply 21.

Figure 6:
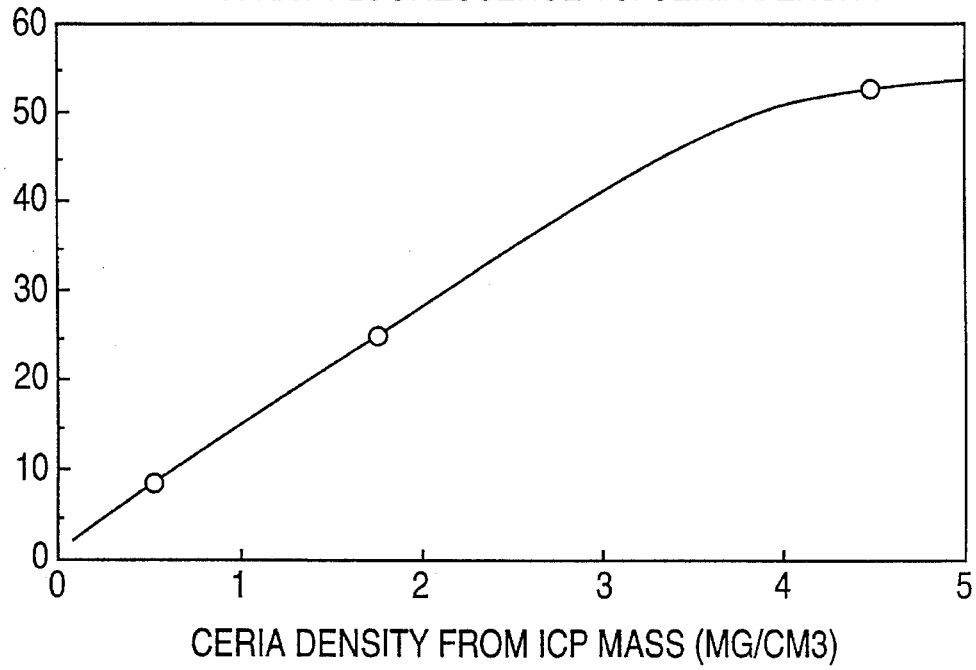
FIG. 6 is a graph showing X-ray intensity as a function of Ceria density in the slurry.

FIG. 6 is a graph showing the X-ray intensity in kilocounts/second expressed as a function of the density in mg/cm$^3$ for a slurry consisting of 1 wt % Ceria ($CeO_2$) suspended in 99 wt % water. Both pad 23 and carrier 5 were rotated at 100 rpm. Wafer 7 was pressed upon pad 23 with a downward pressure of 275 g/cm$^2$. The distance between the center of wafer 7 and the center of pad 23 was 170 mm. The polishing pad was a SUBA-800 manufactured by Rodel. The density is measured in a conventional manner. For example, the pad would be removed and cut, and then dissolved in sulfuric acid ($H_2SO_4$). Thereafter, the density would be determined by the inductively coupled plasma mass spectroscopy (ICP-mass) method. The functional relationship is generated by simultaneously measuring the intensity and density at a plurality of different times during CMP and extrapolating to obtain a correspondence between a given density and detected intensity. The graph of FIG. 6 was plotted based upon three different densities. As discussed further below, by once generating and making use of this functional correspondence, the CMP rate can be determined as well.

Figure 1:
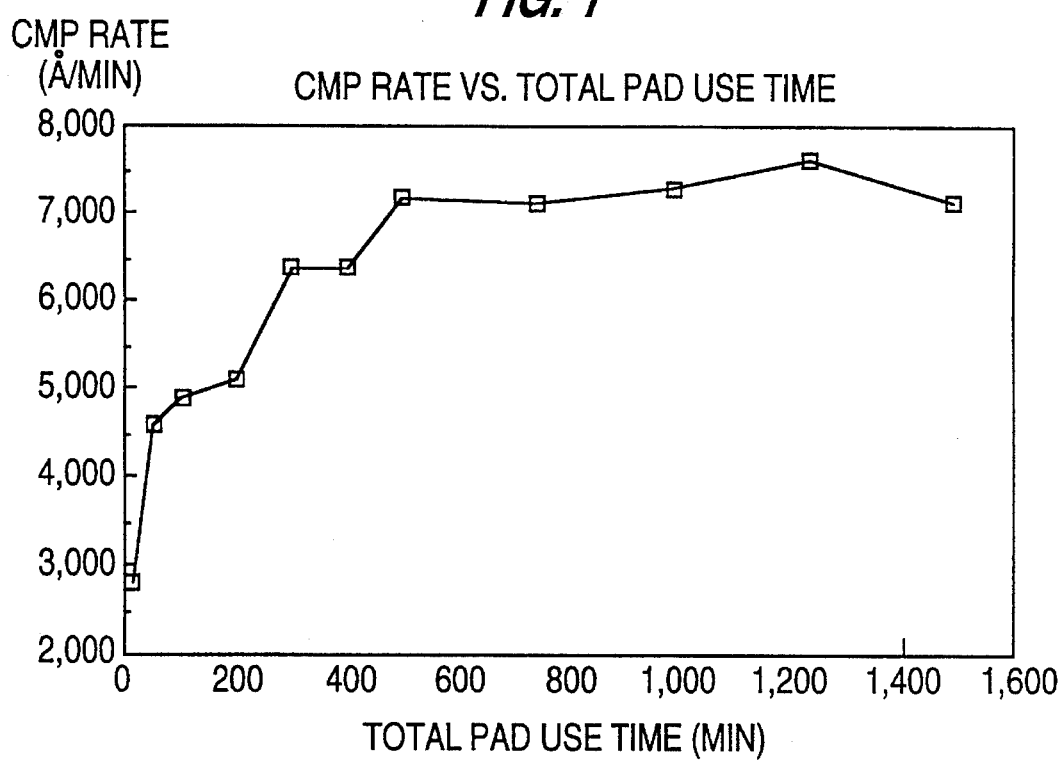
FIG. 1 is a graph showing the polishing rate as a function of total pad use time of a single polishing pad during CMP.
Figure 5:
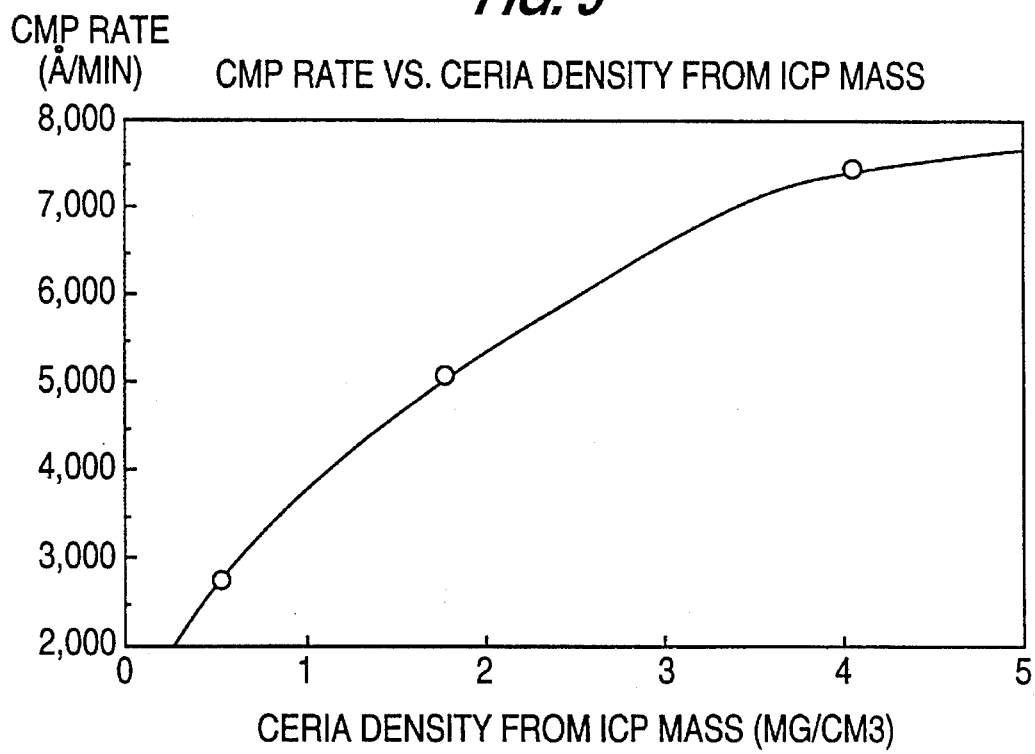
FIG. 5 is a graph showing the CMP rate as a function of the Ceria density in the slurry.

FIG. 5 is a graph of the CMP rate of a silicon oxide ($SiO_2$) layer expressed in Å/min as a function of the Ceria density. At the same time that the graph of FIG. 6 was being generated by measuring the intensity at different densities, the CMP rate was determined by removal Of a test wafer and measuring the thickness to obtain the graph of FIG. 5. Although, as shown in FIG. 5, it is possible to obtain a direct measurement of the CMP rate as function of density, use of this functional relationship to determine the CMP rate requires use of the above-described ICP-mass method in which polishing pad 23 must be removed from the CMP apparatus, and dissolved in sulfuric acid ($H_2SO_4$). However, once the procedure is performed, pad 23 cannot be used again. Even if the pad were reusable, the slurry would have to be replaced. In either case, the results of the analysis would be useless.

Figure 7:
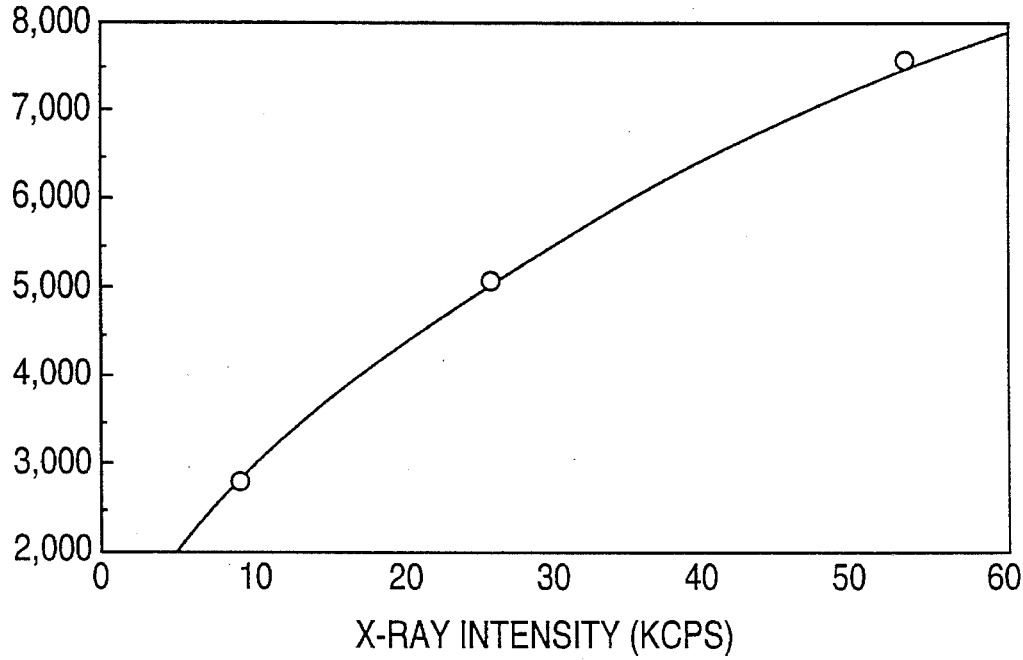
FIG. 7 is a graph showing the CMP rate as a function of X-ray intensity.

Accordingly, it is not practical to directly make use of the functional relationship shown in the graph of FIG. 5 to determine the CMP rate. However, since as shown in FIG. 6, there is a functional relationship between X-ray intensity and Ceria density, and since there is a functional relationship between the CMP rate and Ceria density as shown in FIG. 5, there must be a direct functional relations;hip between the X-ray intensity and the CMP rate. This functional relationship is shown in the graph of FIG. 7, which is a graph of CMP rate as a function of X-ray intensity. The functional relationship of FIG. 7 can be established by once determining the relationships shown in FIGS. 5 and 6 for a chosen combination of pad, slurry and chip layer. Thereafter, by use of calculating circuit 35, the X-ray intensity can be converted directly to a CMP rate by use of the plotted function.

Accordingly, for a given polishing pad, slurry and chip layer upon which CMP is to be applied, the present invention allows for the direct determination and display of the CMP rate. Since the emission of the X-ray beam and detection of the fluorescence does not require removal of the polishing pad or wafer, the CMP rate can be determined without interfering with the CMP process. Accordingly, the CMP rate can be determined without loss of time or destruction of a usable wafer. Further, the CMP rate may be determined instantaneously throughout the polishing process. Thus, any variation in the CMP rate which would affect whether the layers will have thickness variations within the accepted tolerances will be known immediately.

Knowledge of the CMP rate by the present invention allows for instantaneous adjustments to be made. If necessary, the CMP rate can be adjusted by changing the downward pressure or rotating speed of the wafer, pad or both. Further, the microprocessor can be programmed to continuously calculate the quantity of material removed by CMP by making use of the detected CMP rate and duration at which CMP is applied at that rate. The microprocessor can be programmed such that after it has been determined that a desired quantity of material has been removed, CMP is discontinued.

As shown, the graphs of FIGS. 5 and 6 were plotted based on measurements made at three different densities of Ceria. Accordingly, the graph of FIG. 7 also was based upon three measurements. The actual number of measurements needed will depend upon the tolerances needed for the particular layer being polished, and is left up to the skilled practitioner. Of course, the more measurements which are made, the greater the accuracy. Furthermore, the graphs of FIGS. 5–7 are based upon measurements made at the above-noted rotation rates of the pad and wafer, center of pad to center of wafer distance and wafer pressure. The CMP rate for a given density will vary with variations in these factors. By making measurements of the CMP rate v. density and X-ray intensity v. density for variations in these factors, the CMP rate can be known as a function of the intensity at different rotation rates, center to center distances and pressures.

The uniformity of the distribution of the Ceria on the pad and the uniformity of pad wear also affect the uniformity of polishing. By adjusting the angle of incidence of the X-ray beam, the polishing rate at different locations throughout the surface of the polishing pad can be known. For example, the beam can be moved in a radial direction along the pad, from the inner radial location (a) of the pad which contacts the wafer, to the outer radial location (b). Alternatively, the position of the beam can remain stationary, while the pad is slowly rotated so that the polishing rate at different locations along a constant pad radius can be determined. In either case, if deviations in the polishing rate are detected, and the deviations are beyond a threshold level, the pad can be reconditioned by removal of the embedded abrasive particles, or if necessary, discarded. These adjustments of the beam position could be performed by conventional motors.

Although the invention was described above with respect to polishing of a silicon oxide layer, it also is applicable to polishing of other layers, for example, tungsten layers. Furthermore, a similar relationship exists between the CMP rate and the quantity of material removed from the polished layer. In particular, both the CMP rate and X-ray intensity are functions of the density of removed $SiO_2$ in the slurry. Accordingly, in the same manner as discussed above with respect to the density of the particles in the slurry, a graph can be plotted showing the CMP rate as a function of the X-ray intensity, with the graph calculated based upon the measured density of $SiO_2$ in the slurry.

Figure 8A:
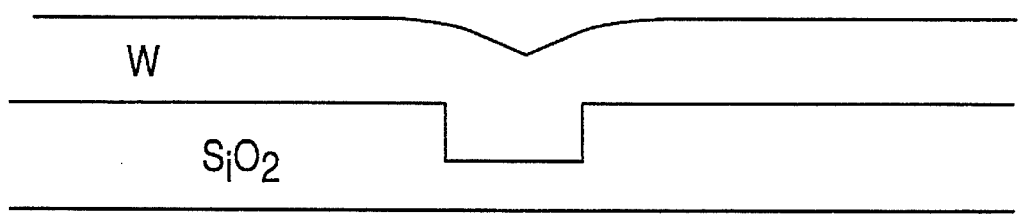
FIGS. 8a and 8b are cross-sectional views of a wafer surface before and after polishing of a tungsten layer.
Figure 8B:
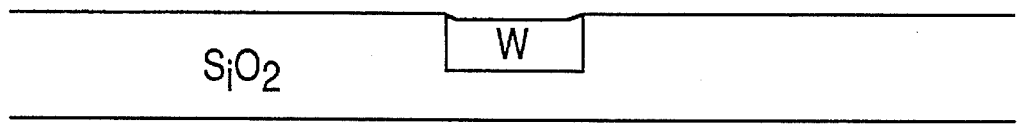

The relationship between X-ray fluorescence and the density of suspended particles in the slurry also can be used to determine the polishing end point during CMP. FIG. 8a shows a wafer including a layer of tungsten W disposed on a layer of $SiO_2$ by a conventional technique. The $SiO_2$ layer includes a trench which is filled with the tungsten. The wafer undergoes CMP, for example, with a slurry including $Al_2O_3$ as an abrasive, to remove the tungsten from the $SiO_2$ layer, with the exception of the material in the trench. FIG. 8b shows the wafer at the desired endpoint of CMP, in which the surface of the tungsten in the trench is substantially level with the surface of the $SiO_2$, although as shown, in practice the tungsten layer in the trench may have a slightly concave surface.

Figure 9:
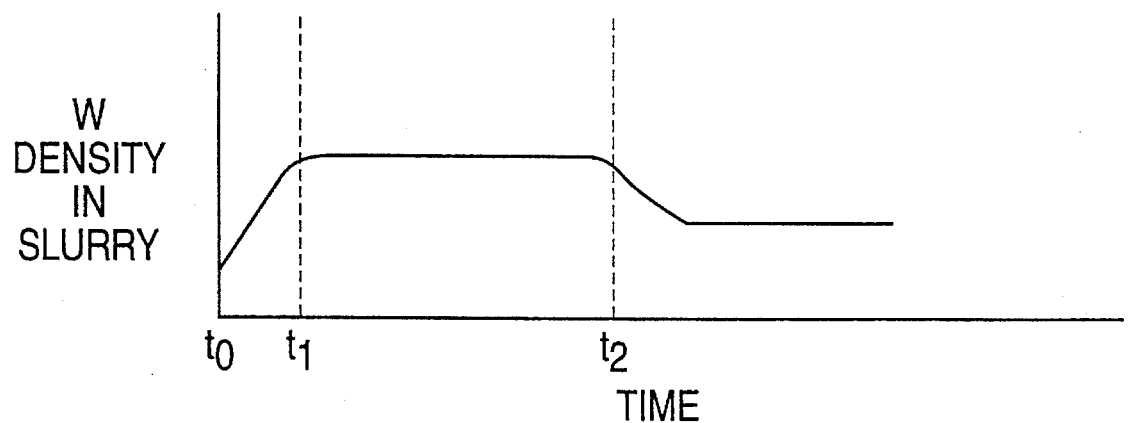
FIG. 9 is a graph representing the density of the tungsten in the slurry during polishing.

FIG. 9 is a graph showing the density of the removed tungsten in the slurry as a function of time. At the initiation of CMP at time $t_0$, there will be little or no tungsten in the slurry. As CMP proceeds, the tungsten initially will be removed at a rapid rate exceeding the rate at which the slurry is sprayed on the pad such that the density of the tungsten in the slurry will increase rapidly as well until time $t_1$. Thereafter, a steady state of tungsten removal and spraying of slurry will be reached in which the density will remain substantially constant. At time $t_2$, the tungsten layer covering the $SiO_2$ will be substantially entirely removed. Thereafter, only the tungsten within the trench will be removed due to further polishing. At this point, the density of tungsten in the slurry will begin to drop rapidly.

Accordingly, the time at which the tungsten density begins to drop rapidly generally corresponds to the desired CMP endpoint. As discussed above, there will be a direct relationship between the X-ray fluorescence intensity and tungsten density, similar to the relationship shown in FIG. 6 for Ceria, with the intensity remaining constant when the density remains constant, and the intensity decreasing when the density decreases. Accordingly, by monitoring the fluorescence to determine when there is a sudden drop in intensity, the desired CMP endpoint can be detected. In practice, CMP could be terminated when the intensity undergoes a reduction to a level which is less than a predetermined level, or is decreased by greater than a predetermined rate. Furthermore, although this aspect of the invention is disclosed with respect to removal of a tungsten layer, it will also work for CMP of other layers, for example, polishing of a $SiO_2$ layer with a slurry including $CeO_2$ as the abrasive particles. In this type of polishing the density of silicon in the slurry would be detected.

Though the above invention has been described for one particular slurry, polishing pad and layer upon which CMP is being applied, it should be understood that the invention is broadly applicable to any particular slurry, pad and surface to be polished. Thus, the invention has broad applicability to all CMP polishing techniques.

This invention has been described in detail in connection with the preferred embodiments. These embodiments, however, are merely for example only and the invention is not restricted thereto. It will be understood by those skilled in the art that other variations and modifications can easily be made within the scope of this invention as defined by the claims.

We claim:

1. A method for determining the polishing rate during abrasive polishing of the surface of a semi-conductor wafer in which a slurry including a liquid having a suspension of abrasive particles is sprayed upon a surface of a rotating polishing pad and a rotating semi-conductor wafer is brought into contact with the surface of the polishing pad, a portion of the surface of the pad exposed during contact, the method comprising:

directing electromagnetic radiation onto the exposed surface of the pad;

detecting the intensity of the electromagnetic radiation produced due to the electromagnetic radiation being directed upon the pad; and converting the detected intensity into a polishing rate of removal of the surface of the wafer by utilizing a predetermined functional relationship between the intensity and the polishing rate.

2. The method recited in claim 1, the electromagnetic radiation comprising a beam which stimulates fluorescence in the slurry such that the intensity of the fluorescence is detected.

3. The method recited in claim 2, the beam comprising an X-ray beam and the fluorescence comprising X-ray fluorescence.

4. The method recited in claim 3, wherein, the abrasive polishing is chemical mechanical polishing.

5. The method recited in claim 4, wherein, the converting step includes utilizing a predetermined functional relationship between the intensity and the density of removed material from the wafer in the slurry and between the polishing rate and the density of removed materials in the slurry.

6. The method recited in claim 5, wherein, the removed material is $SiO_2$.

7. The method recited in claim 4, wherein, the converting step includes utilizing a predetermined functional relationship between the intensity and the density of the abrasive particles in the slurry and between the polishing rate and density of abrasive particles in the slurry.

8. The method recited in claim 7, wherein, the abrasive particles are $CeO_2$ and the liquid includes water.

9. The method recited in claim 3, wherein, the liquid includes water and the abrasive particles include $CeO_2$.

10. A method for performing abrasive polishing comprising:

rotating a polishing pad and spraying a slurry including a liquid having a suspension of abrasive particles onto a surface of the pad;

rotating a semi-conductor wafer and bringing the rotating wafer into contact with the surface of the pad with an area of the surface of the pad exposed during contact;

directing electromagnetic radiation at the exposed surface area of the pad;

detecting the intensity of the electromagnetic radiation produced due to the electromagnetic radiation being directed upon the pad; and converting the detected intensity into a polishing rate of removal of the surface of the wafer by utilizing a predetermined functional relationship between the intensity and the polishing rate.

11. The method recited in claim 10, the electromagnetic radiation comprising a beam which stimulates fluorescence in the slurry such that the intensity of the fluorescence is detected.

12. The method recited in claim 11, the beam comprising an X-ray beam and the fluorescence comprising X-ray fluorescence.

13. The method recited in claim 12, wherein, the liquid is water and the abrasive particles are $CeO_2$.

14. The method recited in claim 12, wherein, the abrasive polishing is chemical mechanical polishing.

15. The method recited in claim 14, wherein, the liquid is a base.

16. The method recited in claim 14, wherein, the liquid is an acid.

17. An apparatus for determining the polishing rate during abrasive polishing of the surface of a semi-conductor wafer in which a slurry including a liquid having a suspension of abrasive particles is sprayed upon a surface of a rotating polishing pad and a rotating semi-conductor wafer is brought into contact with the surface of the polishing pad with a portion of the surface of the pad exposed during contact, the apparatus comprising:

means for directing electromagnetic radiation at the exposed surface of the pad;

means for detecting the intensity of the electromagnetic radiation produced due to the electromagnetic radiation being directed upon the pad; and means for converting the detected intensity into a polishing rate of removal of the surface of the wafer.

18. The apparatus recited in claim 17, the electromagnetic radiation comprising a beam which stimulates fluorescence in the slurry such that the intensity of the fluorescence is detected.

19. The apparatus recited in claim 18, the beam comprising an X-ray beam and the fluorescence comprising X-ray fluorescence.

20. The apparatus recited in claim 19, said means for converting comprising means for storing a predetermined functional relationship between the intensity and the polishing rate, and means for applying the stored functional relationship to the detected intensity to determine the polishing rate.

21. The apparatus recited in claim 19, said means for directing comprising an X-ray tube and said means for detecting comprising an X-ray spectrometer.

22. A semi-conductor workpiece processing machine comprising:

a rotatable workpiece carrier, the rotating motion of the carrier being imparted to a workpiece carried thereon;

a rotatable polishing pad having an upper surface, said carrier and pad relatively movable to allow the workpiece to be brought into contact with said pad, said pad having a larger surface area than the workpiece so as to leave a surface of the pad exposed when the workpiece is in contact with said pad;

a slurry dispenser disposed to dispense slurry upon the upper surface of said pad;

an X-ray tube disposed to direct an X-ray beam at the exposed surface area of the pad;

an X-ray spectrometer, said spectrometer receiving the fluorescence reflected from the pad and determining the intensity thereof; and means for converting the intensity of the reflected beam into a polishing rate of removal of the surface of the wafer and for providing a readout of the rate.

23. A method for performing abrasive polishing comprising:

rotating a polishing pad and spraying a slurry including a liquid having a suspension of abrasive particles onto a surface of the pad rotating a semi-conductor wafer and bringing the rotating wafer into contact with the surface of the pad with an area of the surface of the pad exposed during contact;

directing electromagnetic radiation at the exposed surface area of the pad;

detecting the intensity of the electromagnetic radiation produced due to the electromagnetic radiation being directed upon the pad; and terminating polishing when, after the detected intensity has first reached a substantially steady level, the intensity undergoes a reduction to a level which is less than a predetermined level.

\* \* \* \* \*